US011234515B2

(12) United States Patent
Ofenloch et al.

(10) Patent No.: US 11,234,515 B2
(45) Date of Patent: Feb. 1, 2022

(54) RAIL FIXING SYSTEM WITH SYSTEM COUPLING

(71) Applicant: TE Connectivity Germany GmbH, Bensheim (DE)

(72) Inventors: Markus Ofenloch, Burstadt (DE); Ufuk Tuey, Mannheim (DE); Frank Zimmer, Darmstadt (DE); Sandra Heck, Riedstadt (DE)

(73) Assignee: TE Connectivity Germany GmbH, Bensheim (DE)

( * ) Notice: Subject to any disclaimer, the term of this patent is extended or adjusted under 35 U.S.C. 154(b) by 742 days.

(21) Appl. No.: 16/124,508

(22) Filed: Sep. 7, 2018

(65) Prior Publication Data

US 2019/0000229 A1    Jan. 3, 2019

Related U.S. Application Data

(63) Continuation of application No. PCT/EP2017/055258, filed on Mar. 7, 2017.

(30) Foreign Application Priority Data

Mar. 7, 2016 (DE) .................... 10 2016 203 700.5

(51) Int. Cl.
  *A47B 88/423* (2017.01)
  *H02B 1/052* (2006.01)
  (Continued)

(52) U.S. Cl.
  CPC .......... *A47B 88/423* (2017.01); *H02B 1/041* (2013.01); *H02B 1/0523* (2013.01); *H05K 7/14* (2013.01)

(58) Field of Classification Search
  CPC .... A47B 88/423; H02B 1/0523; H02B 1/041; H05K 7/14
  See application file for complete search history.

(56) References Cited

U.S. PATENT DOCUMENTS

| | | | | |
|---|---|---|---|---|
| 4,454,382 A | * | 6/1984 | Borne | H02B 1/052 174/158 R |
| 6,038,130 A | * | 3/2000 | Boeck | H01R 9/2675 361/735 |

(Continued)

FOREIGN PATENT DOCUMENTS

| | | |
|---|---|---|
| DE | 4011447 A1 | 10/1991 |
| DE | 19748530 C1 | 2/1999 |

OTHER PUBLICATIONS

PCT Notification, The International Search Report and the Written Opinion of the International Searching Authority, dated Apr. 24, 2017, 12 pages.

(Continued)

*Primary Examiner* — Hanh V Tran
(74) *Attorney, Agent, or Firm* — Barley Snyder

(57) ABSTRACT

A rail fixing system comprises a rail fixing arrangement adapted to fix the rail fixing system to a profile rail, a system coupling arrangement adapted to fix the rail fixing system to another rail fixing system disposed adjacent to the rail fixing system on the profile rail, and an actuation device common to the rail fixing arrangement and the system coupling arrangement. The actuation device is connected to a first positive-locking connection element of the rail fixing arrangement and a second positive-locking connection element of the system coupling arrangement. The actuation device is supported on a resilient element and the first positive-locking connection element, the second positive-locking connection element, and the resilient element are arranged along a straight line that extends in an effective direction of the resilient element.

17 Claims, 10 Drawing Sheets

(51) Int. Cl.
*H02B 1/04* (2006.01)
*H05K 7/14* (2006.01)

(56) References Cited

U.S. PATENT DOCUMENTS

| | | | | |
|---|---|---|---|---|
| 6,224,429 B1* | 5/2001 | Bernhards | ............ | H01R 9/2608 |
| | | | | 439/709 |
| 6,322,399 B1* | 11/2001 | Hanning | ................... | H01R 9/26 |
| | | | | 439/406 |
| 6,371,435 B1* | 4/2002 | Landis | ................... | H02B 1/052 |
| | | | | 248/694 |
| 6,454,614 B1* | 9/2002 | Bechaz | ................. | H02B 1/052 |
| | | | | 439/532 |
| 7,035,096 B2* | 4/2006 | Franz | ................... | G06F 1/184 |
| | | | | 312/223.1 |
| 9,485,879 B2* | 11/2016 | Molnar | ................ | H05K 5/0026 |
| 9,545,027 B2* | 1/2017 | Chiang | .................... | H05K 7/12 |
| 10,263,399 B2* | 4/2019 | Bocker | ................. | H02B 1/052 |
| 10,340,668 B2* | 7/2019 | Siehler | ................... | H02B 1/052 |
| 10,390,449 B2* | 8/2019 | Jiang | ..................... | H02B 1/0523 |
| 2006/0079124 A1* | 4/2006 | Barile | .................... | H02B 1/052 |
| | | | | 439/532 |
| 2007/0008708 A1* | 1/2007 | Hanning | ................ | H02B 1/052 |
| | | | | 361/801 |
| 2008/0108248 A1* | 5/2008 | Lim | ....................... | H02B 1/052 |
| | | | | 439/532 |
| 2011/0164393 A1* | 7/2011 | Wang | .................... | H02B 1/052 |
| | | | | 361/809 |
| 2013/0216304 A1* | 8/2013 | Schumacher | ........ | H01R 13/633 |
| | | | | 403/376 |
| 2014/0339186 A1* | 11/2014 | Cachia | ................. | H02B 1/0526 |
| | | | | 211/182 |
| 2015/0034652 A1* | 2/2015 | Petricek | ................. | H05K 7/183 |
| | | | | 220/324 |
| 2015/0181745 A1* | 6/2015 | Hand | .................... | H05K 7/1417 |
| | | | | 403/326 |
| 2015/0382492 A1* | 12/2015 | Oneufer | ............... | H05K 5/0017 |
| | | | | 312/295 |
| 2019/0350093 A1* | 11/2019 | Lin | ...................... | F16M 13/022 |

OTHER PUBLICATIONS

Abstract of DE19748530, dated Feb. 4, 1999, 1 page.
Abstract of EP0451726, dated Oct. 16, 1991, 1 page, also published as DE4011447.

* cited by examiner

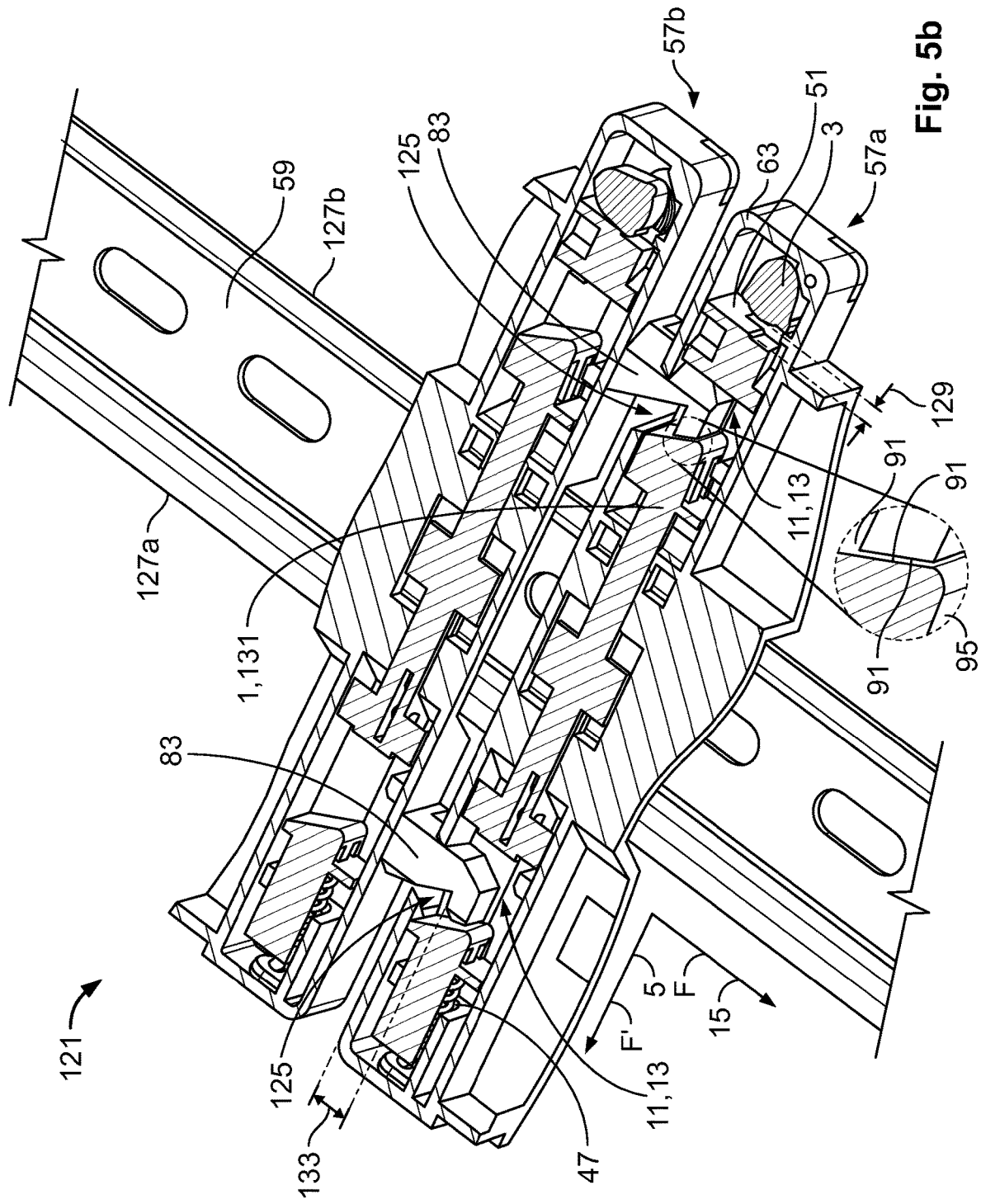

RAIL FIXING SYSTEM WITH SYSTEM COUPLING

CROSS-REFERENCE TO RELATED APPLICATIONS

This application is a continuation of PCT International Application No. PCT/EP2017/055258, filed on Mar. 7, 2017, which claims priority under 35 U.S.C. § 119 to German Patent Application No. 102016203700.5, filed on Mar. 7, 2016.

FIELD OF THE INVENTION

The present invention relates to a rail fixing system and, more particularly, to a rail fixing system capable of being fixed to a profile rail.

BACKGROUND

German Patent No. 4011447 A1 discloses a rail fixing system for rapid fixing of an electrical installation device. An actuation device of the rail fixing system is used to move a clamping element of the rail fixing system into an open position or a closed position. Rail fixing systems of the prior art have a rail fixing arrangement and a system coupling arrangement with a common actuation device. The common actuation device, however, can become jammed or cannot reliably ensure retention forces which are necessary for the system coupling. Further, the rail fixing systems of the prior art relate only to a single rail fixing system.

SUMMARY

A rail fixing system comprises a rail fixing arrangement adapted to fix the rail fixing system to a profile rail, a system coupling arrangement adapted to fix the rail fixing system to another rail fixing system disposed adjacent to the rail fixing system on the profile rail, and an actuation device common to the rail fixing arrangement and the system coupling arrangement. The actuation device is connected to a first positive-locking connection element of the rail fixing arrangement and a second positive-locking connection element of the system coupling arrangement. The actuation device is supported on a resilient element and the first positive-locking connection element, the second positive-locking connection element, and the resilient element are arranged along a straight line that extends in an effective direction of the resilient element.

BRIEF DESCRIPTION OF THE DRAWINGS

The invention will now be described by way of example with reference to the accompanying Figures, of which:

FIG. 5B is a sectional perspective view of the set of rail fixing systems during coupling;

DETAILED DESCRIPTION OF THE EMBODIMENT(S)

Figure 1A:
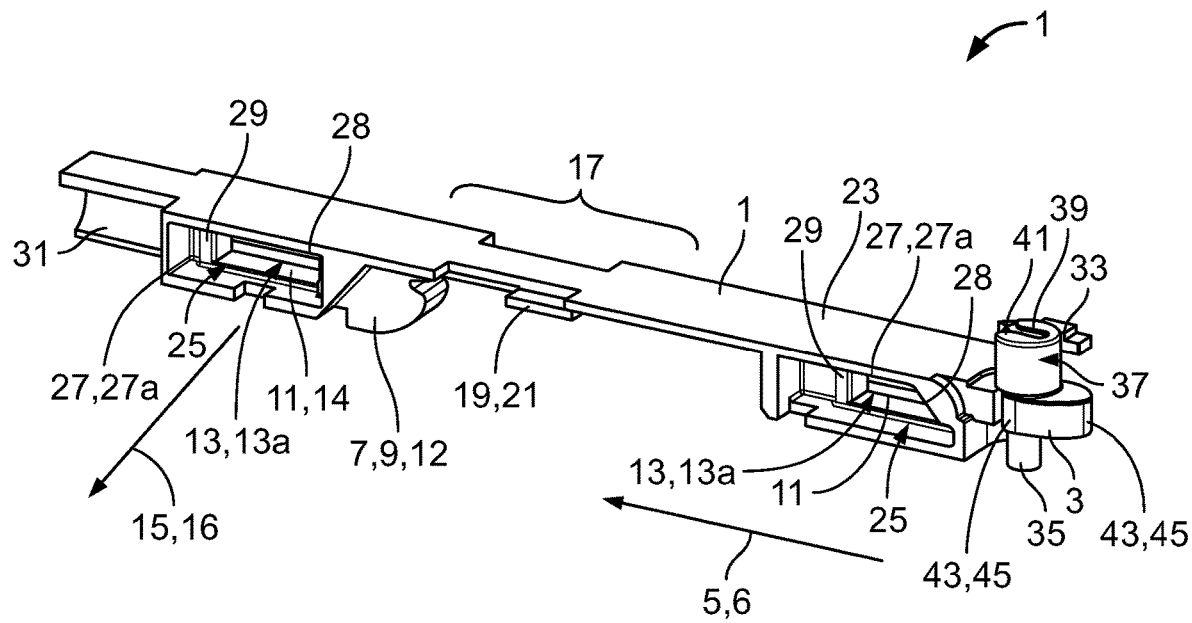
FIG. 1A is a perspective view of an actuation device according to an embodiment.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

An actuation device 1 of a rail fixing system 57 according to an embodiment is shown in FIG. 1A. The actuation device 1 has a cam 3 and extends substantially in a longitudinal direction 5. The actuation device 1 includes a first positive-locking connection element 7 which is constructed as a clamping jaw 9 and two second positive-locking connection elements 11 which are constructed as catch openings 13 or as positive-locking connection openings 13a. The longitudinal direction 5 corresponds to an actuation direction 6.

The first positive-locking connection element 7, as shown in FIG. 1A, is a component of a rail fixing arrangement 12 and the second positive-locking connection element 11 is a component of a system coupling arrangement 14. The rail fixing arrangement 12 is adapted to fix to a profile rail 59 and the system coupling arrangement 14 is adapted to fix to an adjacent rail fixing system 57, as described in greater detail below. The first positive-locking connection element 7 extends substantially counter to the longitudinal direction 5, the catch openings 13 or the positive-locking connection openings 13a are open in or counter to a transverse direction 15 which corresponds to a passage direction 16.

In the central region 17, as shown in FIG. 1A, the actuation device 1 has a support element 19 which is constructed as wing-like struts 21 which extend at both sides; both in and counter to the transverse direction 15. The wing-like struts 21 are arranged parallel with an upper side 23 of the actuation device 1.

As shown in FIG. 1A, the second positive-locking connection elements 11 are substantially constructed as a shaft 25 which extends in a transverse direction 15, wherein shaft walls 27 partially constitute the upper side 23 of the actuation device 1 and each surround a catch wall 29. The catch walls 29 are described in greater detail below. The shaft walls 27 constitute a closed peripheral wall 27a of the positive-locking connection opening 13a. The wall 27a surrounds the positive-locking connection opening 13a, wherein the access locations thereto open in or counter to the transverse direction 15. The walls 27a have a contour 28. The positive-locking connection opening 13a is encoded by the contour 28 of the wall 27a. In FIG. 1A, a first contour 28a is rectangular whereas a second contour 28b is in the form of a parallelogram. The catch openings 13 extend substantially in the longitudinal direction 5.

The actuation device 1, as shown in FIG. 1A, includes a resilient element receiving member 31 extending in the longitudinal direction 5. The actuation device 1 includes a display element 33; in the shown embodiment, the display element 33 is disposed on a right end of the actuation device 1 but, in other embodiments, could be fitted to the actuation device 1 at an opposite end in the longitudinal direction 5. The actuation device 1, in the embodiment shown in FIG. 1A, is monolithically connected to the resilient element receiving member 31, the second positive-locking connection elements 11, the first positive-locking connection element 7, the support element 19, and the display element 33. In an embodiment, the actuation device 1 is monolithically formed in a single piece by injection molding.

The cam 3, as shown in FIG. 1A, is fixed to an axle 35 and has a drive element 37 which is constructed as a groove-like receiving member 39, for example, in order to receive the tip of a screwdriver. The drive element 37 further comprises an indicator element 41 which is constructed as an arrow-head. The cam 3 includes three catch elements 43 which are each constructed as a catch projection 45.

Figure 1B:
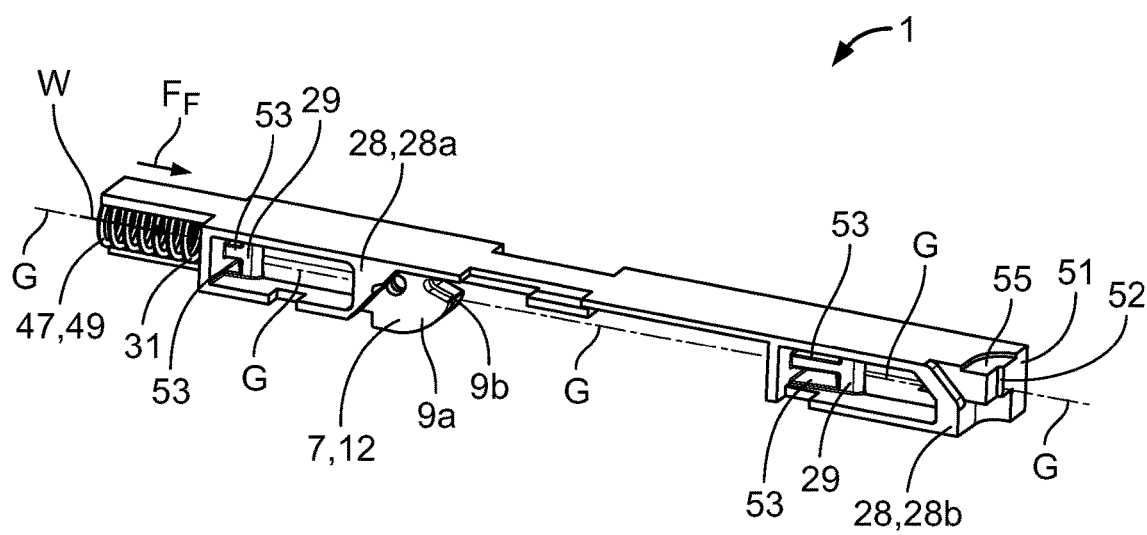
FIG. 1B is a perspective view of an actuation device according to another embodiment.

An actuation device 1 according to another embodiment of the invention is shown in FIG. 1B. In the actuation device 1 shown in FIG. 1B, a resilient element 47 in the form of an annular spring 49 is received in the resilient element receiving member 31. Like reference numbers refer to like elements and only the differences from the actuation device 1 shown in FIG. 1A will be described in detail herein.

The resilient element 47, as shown in FIG. 1B, defines an effective direction W, in which a straight line G extends. The actuation device 1 is supported on the resilient element 47. The first positive-locking connection element 7, the second positive-locking connection element 11 and the resilient element 47 are arranged on that straight line G. The effective direction W is directed in the same direction as a resilient force FF, centrally towards the first positive-locking connection element 7 and the second positive-locking connection element 11, so that tilting as a result of a decentralised positive-locking connection element 7, 11 which is contacted with the resilient force FF is prevented.

In FIG. 1B, the cam 3 of the actuation device 1 is not shown so that an abutment face 51 of the actuation device 1 can be seen. The abutment face 51 has a catch edge 53, which is described in greater detail below. The actuation device 1 of FIG. 1B does not have a display element 33. Further, the first positive-locking connection element 7 comprises two clamping jaws 9a, 9b and the catch walls 29 have openings 53. The distal end of the actuation device 1 with respect to the resilient element receiving member 31 has a recess 55, in which the drive element 37 is partially received.

Figure 2A:
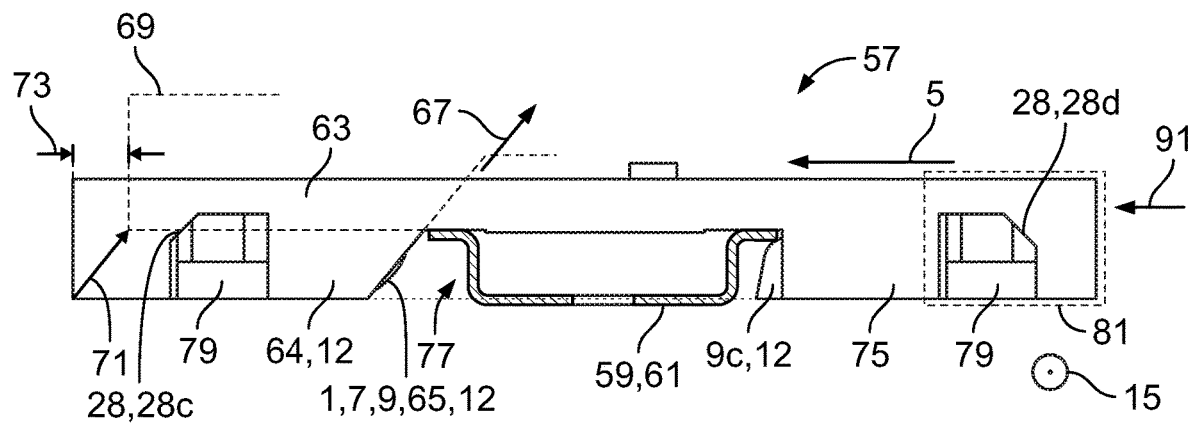
FIG. 2A is a side view of a rail fixing system according to an embodiment on a profile rail.

A rail fixing system 57 according to an embodiment is shown in FIG. 2A. The rail fixing system 57 is positioned on a profile rail 59 which is a top hat rail 61 in the embodiment shown. The rail fixing system 57 includes a housing 63 in which the actuation device 1 is received; the actuation device 1 is substantially completely received inside the housing 63 of the rail fixing system 57. The actuation device 1 is supported at a center of the rail fixing system 57 in a direction perpendicular to the passage direction 16.

Of the actuation device 1, which is in the open position 65 in FIG. 2A, only the first positive-locking connection element 7 in the form of a clamping jaw 9 can be partially seen. In the event of a possible flexion of the actuation device 1, the wing-like strut 21 would abut the inner side of a slot-like guide receiving member of the housing 63 in or counter to the vertical direction and would prevent further flexion of the actuation device 1.

Figure 2B:
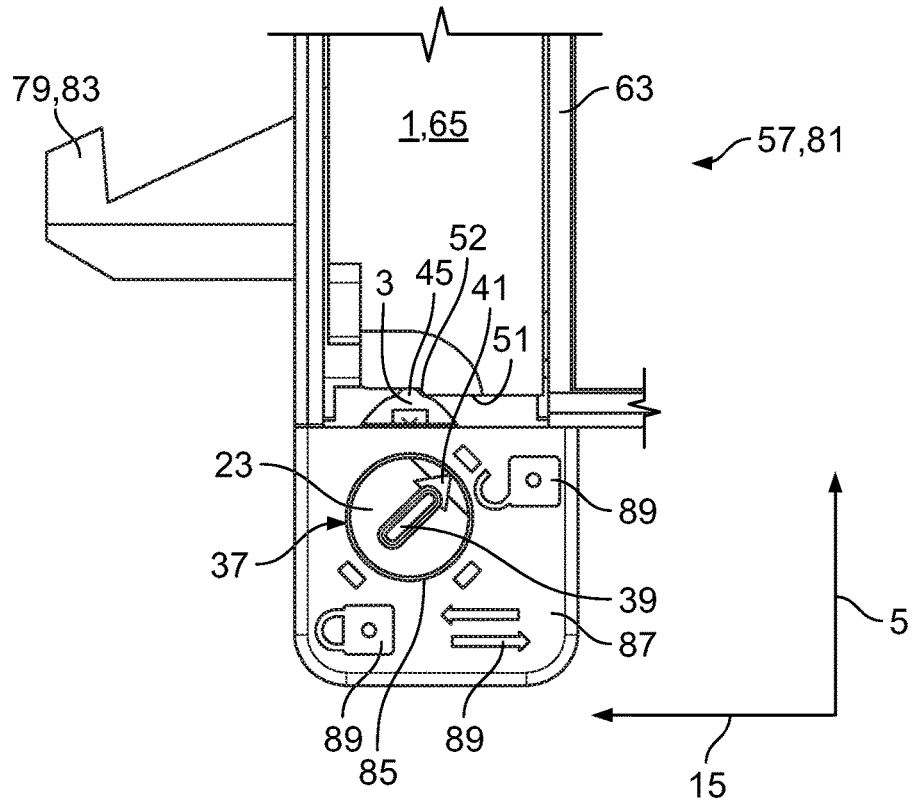
FIG. 2B is a plan view of a portion of the rail fixing system of FIG. 2A in an open position of the rail fixing system.
Figure 2C:
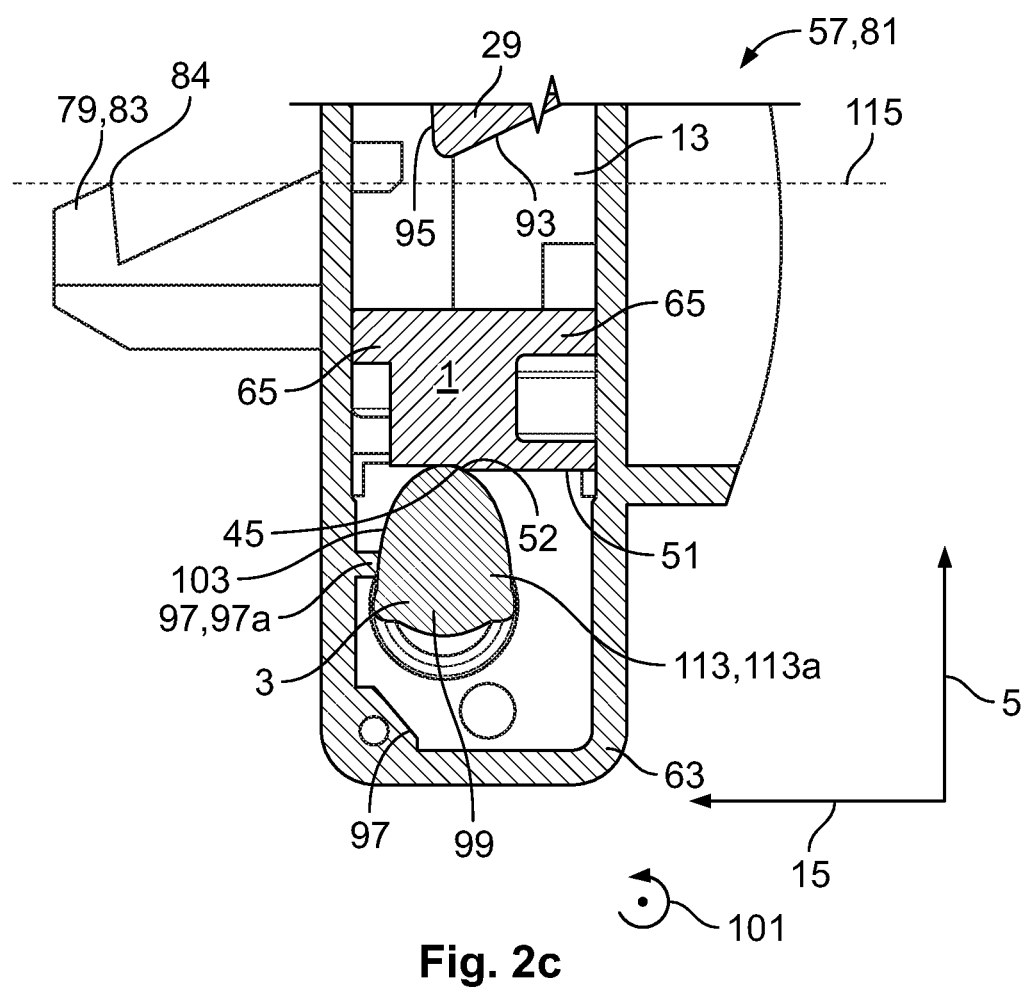
FIG. 2C is a sectional plan view of the rail fixing system of FIG. 2B.

In the open position 65 of the actuation device 1 shown in FIGS. 2A-2C, it is possible to move the rail fixing system 57 away from the profile rail 59 in a removal direction 67. This movement is indicated by a removal position 69 which is indicated with broken lines in FIG. 2A, and a displacement arrow 71 indicates the displacement of the rail fixing system 57 in the removal direction 67. An insertion distance 73 shown in FIG. 2A is a distance by which the rail fixing system 57 has to be displaced in relation to an insertion position 75 counter to the longitudinal direction 5 in order to ensure correct positioning of the rail fixing system 57 on the profile rail 59.

The profile rail 59 is received in a rail receiving member 77 of the rail fixing system 57, as shown in FIG. 2A. In the embodiment shown in FIG. 2A, the profile rail 59 is received almost completely in the rail receiving member 77. The rail receiving member 77 is continuous in a passage direction 16 for the profile rail 59. The straight line G extends through the rail receiving member 77. The term "rail receiving member" is intended to be understood to be the free space which is inside the cubature of the rail fixing system 57 and in which the profile rail 59 can be inserted. The rail receiving member 77 is substantially complementary to the profile rail 59 used.

A rigid clamping jaw 9c, which is non-movable in relation to the housing 63 of the rail fixing system 57, is located at the opposite end of the rail receiving member 77 with respect to the first positive-locking connection element 7 in relation to the longitudinal direction 5. The non-movable clamping jaw 9c and the lateral faces 64 are additional components of a rail fixing arrangement 12 of the rail fixing system 57. A border of the rail receiving member 77 may comprise both lateral faces 64 of the housing 63 and the first positive-locking connection element 7 which can be moved into the rail receiving member 77. The lateral faces 64 are disposed opposite each other in the passage direction 16. Since this element is movable, the shape and size of the rail receiving member 77 may be dependent on the position of the actuation device 1.

In an embodiment, the clamping jaws 9a, 9b are substantially triangular or conical, and a rounded tip of the triangle or the conically formed clamping jaws 9a, 9b can protrude further into the rail receiving member 77 than a base of the triangle or the conically formed clamping jaws. The triangular or conically formed clamping jaws 9a, 9b can be constructed asymmetrically, that is to say that a side wall which extends from the tip of the clamping jaws 9a, 9b can extend in the direction counter to the opening of the rail receiving member 77 at a different angle with respect to a side wall which extends from the tip in the direction of the opening of the rail receiving member 77. Consequently, the tip of the clamping jaw 9a, 9b which is formed in a triangular or conical manner may not project in a vertical extent centrally into the rail receiving member 77 but may instead be constructed so as to be offset in the direction of the opening of the rail receiving member 77 and movable into the rail receiving member 77. In this case, the vertical extent corresponds to an extent of the rail receiving member 77 in a vertical direction which is orientated perpendicularly to the actuation direction 6 and perpendicularly to the passage direction 16.

The rail fixing system 57 also has two counter-elements 79, as shown in FIGS. 2A and 2B. The counter-elements 79 each have a contour 28, wherein a third contour 28c complements a second contour 28b shown in FIG. 1B. However, a fourth contour 28d does not complement the first contour 28a shown in FIG. 1B. In an embodiment, the counter-element 79 is rigid. The contours 28 of the counter-elements 79 are encoded to complement the second positive-locking connection element 11.

FIG. 2B is a detail view of a region 81 of the rail fixing system 57 shown in FIG. 2A. The detail region 81 shows the housing 63, the counter-element 79 which is in the form of a catch hook 83 (the second catch hook 83 is not shown in the detail region 81) and the drive element 37. The catch hook 83 is also a component of the system coupling arrangement 14. Of the drive element 37, only an upper side 23 can be seen, as well as the groove-like receiving member 39 and the indicator element 41.

The drive element 37, as shown in FIG. 2B, is received in a circular receiving member 85 which is located in a covering element 87. The covering element 87 is a monolithic portion of the housing 63. The cam 3, as shown in FIG. 2B, contacts the abutment face 51 in the region of the catch edge 52 with one of the three catch projections 45 thereof and engages the actuation device 1 in the open position 65. The indicator element 41 is directed with the tip thereof towards one of three pictograms 89 which provide the user with simple information relating to the position of the actuation device 1.

FIG. 2C is a sectional view of the detail region 81 shown in FIG. 2B; the section along a plane which is defined by the longitudinal direction 5 and the transverse direction 15 is taken at a height 91 shown in FIG. 2A. The section shown in FIG. 2C is taken under the upper side 23 of the actuation device 1 at the height of the cam 3. The catch opening 13 and a catch wall 29 are shown in FIG. 2C, and the catch wall 29 has an inclined introduction member 93 which is directed away from the catch hook 83 and a catch face 95 which is directed towards the catch hook 83. The catch face 95 is oriented substantially at a small angle relative to the longitudinal direction 5 but the inclined introduction member 93 is oriented at an angle greater than 60° from an angle perpendicular to the longitudinal direction 5. The second positive-locking connection element 11 and the counter-element 79 may have the same coordination in the vertical direction and in the actuation direction 6, wherein the position of both elements may differ only in terms of the coordinate thereof with respect to the passage direction. The opening direction of the catch opening 13 may be parallel with the extent direction of the catch hook 83.

The cam 3, the mechanical contact of one of the three catch projections 45 of the cam 3 with the catch edge 52 of the abutment face 51, and two stop elements 97 which are constructed at the inner side of the housing 63 are shown in FIG. 2C. The first stop element 97a prevents additional rotation of the cam 3 about the center point 99 in a counter-clockwise rotational direction 101, by an outer face 103 of the cam 3 abutting against the first stop element 97a and preventing additional rotation in the rotational direction 101. A rotational position 113 of the cam 3 shown in FIG. 2C corresponds to a first rotational position 113a, wherein this first rotational position 113a results in the open position 65 of the actuation device 1. An auxiliary line 115 shown in FIG. 2C extends parallel with the transverse direction 15 through the tip 84 of the catch hook 83. That auxiliary line 115 extends through the catch opening 13 and does not intersect with the catch wall 29.

Figure 3A:
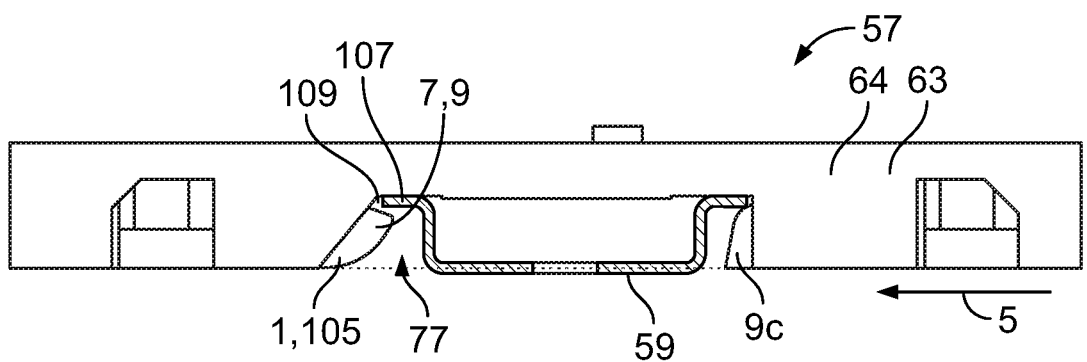
FIG. 3A is a side view of the rail fixing system in a displacement position.
Figure 3B:
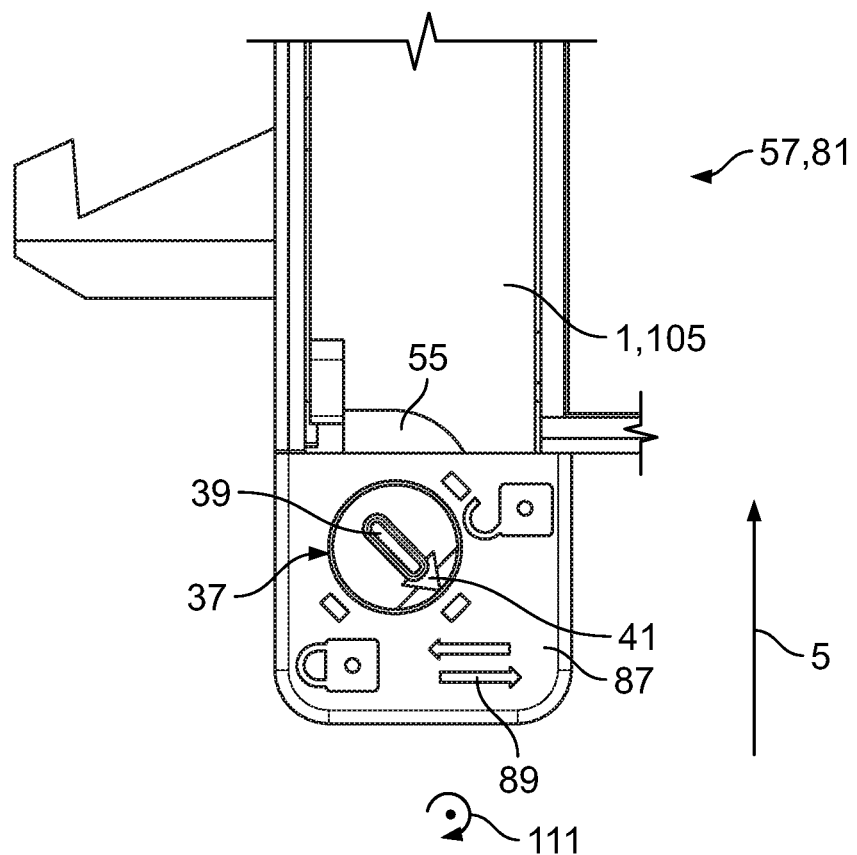
FIG. 3B is a plan view of a portion of the rail fixing system of FIG. 3A in the displacement position.
Figure 3C:
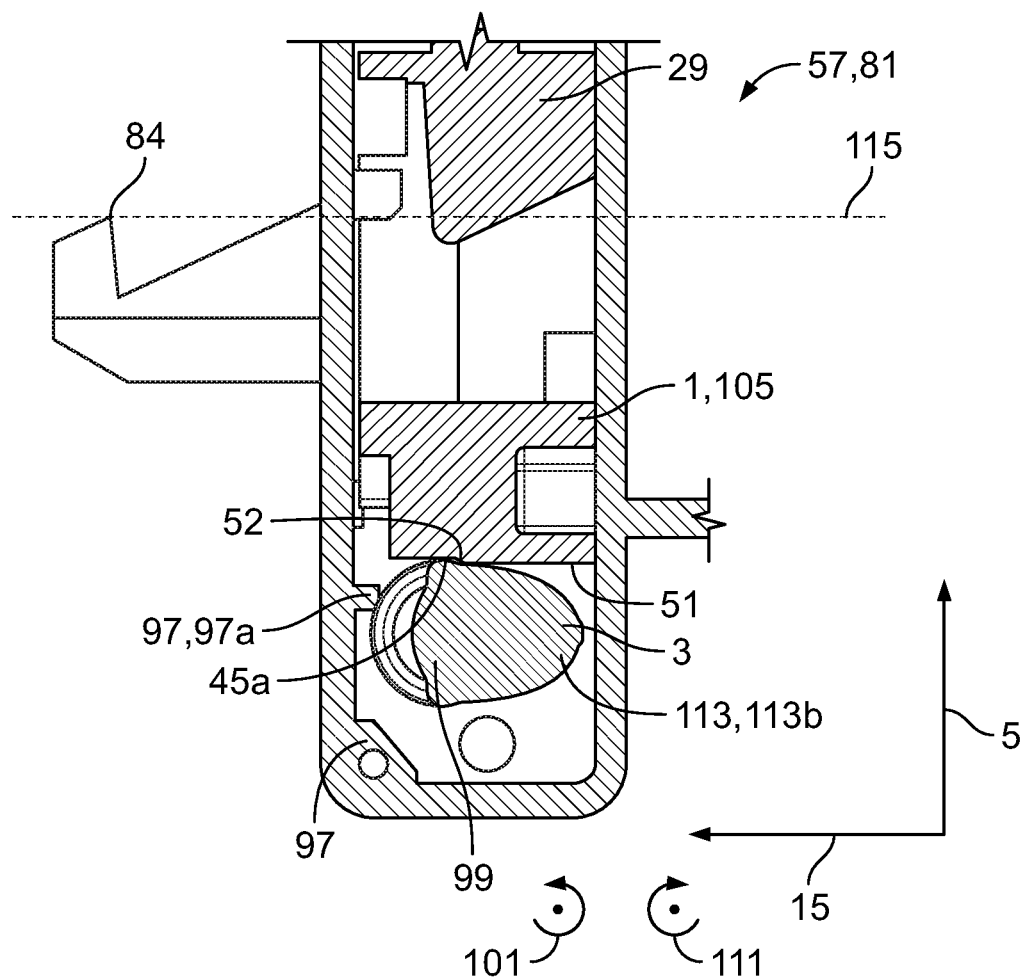
FIG. 3C is a sectional plan view of the rail fixing system of FIG. 3B.

The actuation device 1 of the rail fixing system 57 is shown in a displacement position 105 in FIGS. 3A-3C in which the first positive-locking connection element 7 which is constructed as a clamping jaw 9 projects further into the rail receiving member 77 than in the open position 65. By the clamping jaw 9 moving into the rail receiving member 77, the size of the rail receiving member 77 decreases which is illustrated by a dotted line.

In the displacement position 105 of the actuation device 1, as shown in FIG. 3A, the rail fixing system 57 is connected to the profile rail 59 in a non-releasable manner. There remains between the clamping jaw 9 and a first rail side 107 a play 109 which allows displacement of the rail fixing system 57 in or counter to the transverse direction 15; in the case of any other movement of the rail fixing system 57, it abuts against the profile rail 59 with the lateral face 64 of the housing 63, with the clamping jaw 9 or with the non-movable clamping jaw 9c, and prevents additional movement of the rail fixing system 57. In the displacement position, although the rail fixing system 57 is connected to the profile rail 59 in a non-releasable manner, the connection does not prevent the displacement along the profile rail 59.

If the actuation device 1 and the first positive-locking connection element 7 connected thereto are located in the displacement position 105, the rail receiving member 77 may have a clear width, measured in the actuation direction 6 and parallel with the actuation device 1 at the height of the tip of the triangular or conical clamping element, which is smaller than the width of the profile rail 59. In a region of the rail receiving member 77 which is further away from the opening, the rail receiving member 77 has a clear width which may further be greater than the width of the profile rail 59. Specifically, the clear width measured in the upper region can be dimensioned so that the profile rail 59 in this region abuts the inner walls or inwardly projecting elements of the rail receiving member 77 with a play 109 but, as a result of this abutment, apart from the weight forces which cannot be avoided, no additional forces at all, for example, as a result of resilient elements, are transmitted from the rail fixing system 57 to the profile rail 59.

As shown in FIG. 3B, in the displacement position 105, the drive element 37 has been rotated in a clockwise rotational direction 111. In an embodiment, this is carried out by inserting the tip of a screwdriver into the groove-like receiving members 39 and subsequent rotation of the drive element 37 by the screwdriver. The drive element 37 is rotated an angle of substantially 90°, wherein the precise rotation is dependent on the cam 3 and the number of engagement positions of the actuation device 1. The indicator element 41 is now directed towards a second pictogram 89 which indicates the position of the actuation device 1 in the displacement position 105. As the actuation device 1 has been displaced counter to the longitudinal direction 5, the support face 51 in FIG. 3B is covered by the covering element 87 and only the recess 55 can be seen.

As shown in FIG. 3C, the cam 3 which is rotated through 90° in the clockwise direction is responsible for the actuation device 1 being moved counter to the longitudinal direction 5. A resilient element 47, shown in FIG. 1B, applies the resilient force FF to the actuation device 1 counter to the longitudinal direction 5. The catch edge 52 of the stop face 51 as shown in FIG. 3C forms with a lateral catch projection 45a a positive-locking engagement so that an action of force of the actuation device 1 counter to the longitudinal direction 5 does not bring about a rotation of the cam 3. The rotational position 113 of the cam 3 in FIG. 3C corresponds to a second rotational position 113b, wherein this second rotational position 113b results in the displacement position 105 of the actuation device 1.

As shown in FIG. 3C, none of the stop elements 97, 97a is in contact with the cam 3 so that the cam 3 can be rotated about the center point 99 both in a counter-clockwise rotational direction 101 and in a clockwise rotational direction 111. The auxiliary line 115 intersects with the catch wall 29 in the displacement position 105 of the actuation device 1. The auxiliary line 115 will be described in greater detail below with reference to FIGS. 5A-5C.

Figure 4A:
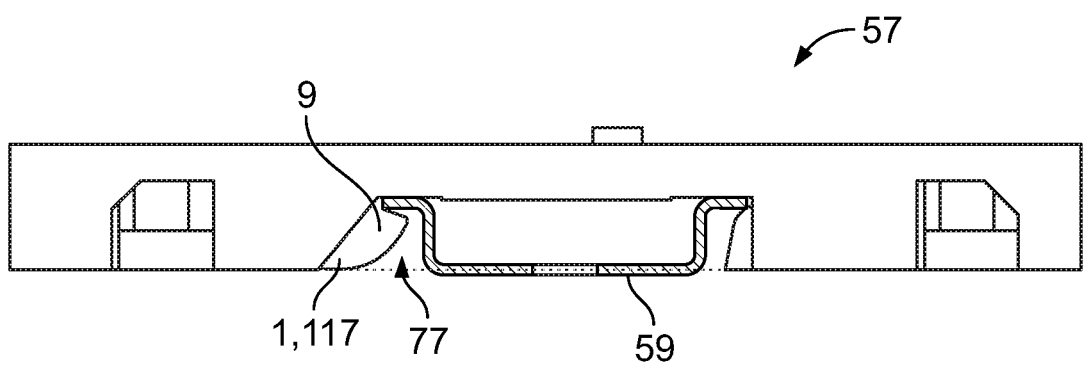
FIG. 4A is a side view of the rail fixing system in a closed position.
Figure 4B:
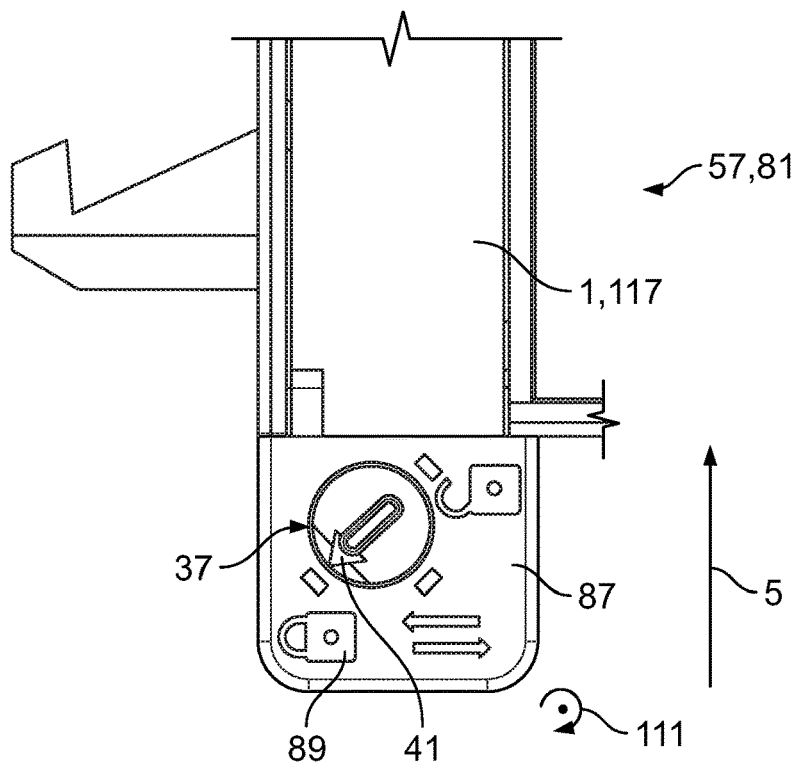
FIG. 4B is a plan view of a portion of the rail fixing system of FIG. 4A in the closed position.
Figure 4C:
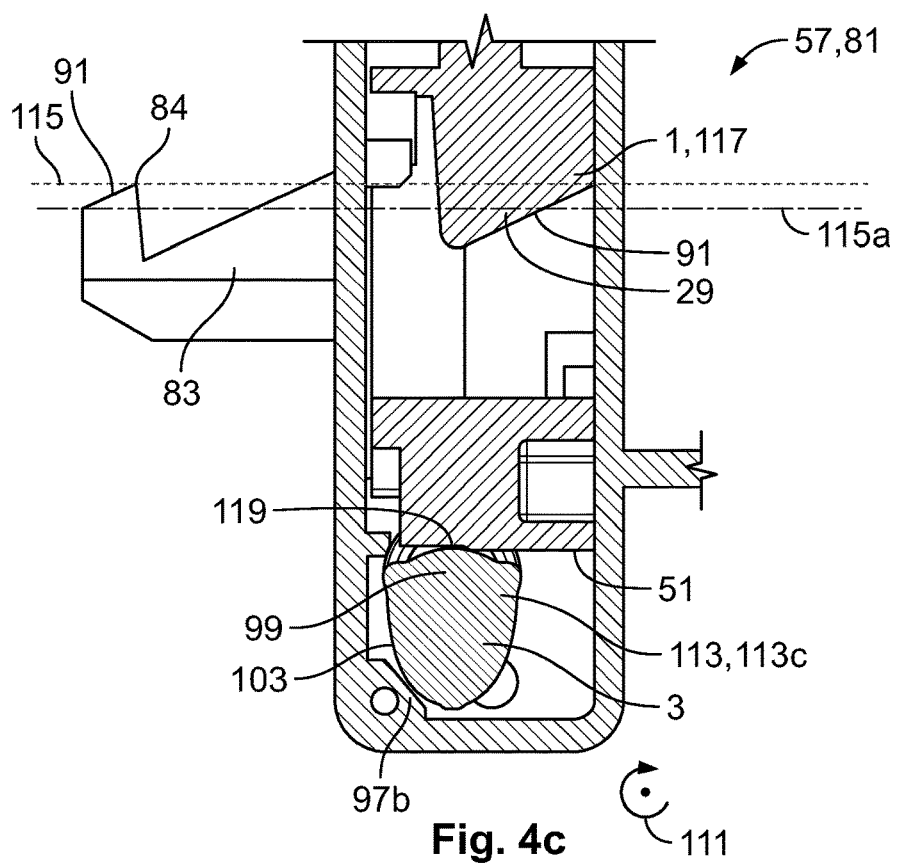
FIG. 4C is a sectional plan view of the rail fixing system of FIG. 4B.

The actuation device 1 is shown in the closed position 117 in FIGS. 4A-4C, in which the clamping jaw 9 is received in the rail receiving member 77 to a greater extent than in the displacement position 105 shown in FIG. 3A. The clamping jaw 9 substantially brings about a positive-locking connection of the rail receiving member 77 with portions of the profile rail 59 so that no play remains between the rail fixing system 57 and the profile rail 59. The clamping jaw 9 is pressed into the rail receiving member 77 by the resilient element 47 and against the profile rail 59.

The drive element 37, as shown in FIG. 4B, is rotated by an additional 90° in a clockwise rotational direction 111 in comparison with FIG. 3B. The indicator element 41 is directed in FIG. 4B towards the third pictogram 89 and indicates that the actuation device 1 is in the closed position 117. Since the actuation device 1 in the closed position 117 is displaced further counter to the longitudinal direction 5 in comparison with the displacement position 105, the recess 55 is now also covered by the covering element 87.

As shown in FIG. 4C, the cam 3 is in a rotational position 113 which corresponds to a third rotational position 113c, wherein this third rotational position 113c results in the closed position 117 of the actuation device 1. In the rotational position 113c, the outer face 103 of the cam 3 contacts a second stop element 97b so that an additional rotation of the cam 3 about the center point 99 in the clockwise rotational direction 111 is prevented. The actuation device 1 abuts in the closed position 117 against a near point 119 of the outer face 103 of the cam 3 with the abutment face 51 thereof. The near point 119 is nearest the center point 99 of the cam 3 of all the points located on the outer face 103. The auxiliary line 115 is also shown in FIG. 4C, wherein it intersects with the catch wall 29.

The engagement of two identical rail fixing systems 57 which constitute a set 121 of rail fixing systems 57 with each other and with respect to the profile rail 59 will now be described in greater detail with reference to FIGS. 5A-5C. Both rail fixing systems 57 are part of a device indicated by the cutaway housing portion 123. The rail fixing system 57 which is positioned on the profile rail 59 further in the transverse direction 15 is referred to as the first rail fixing system 57a and the rail fixing system 57 which is positioned on the profile rail 59 to a lesser extent in the transverse direction 15 is referred to as the second rail fixing system 57b.

Figure 5A:
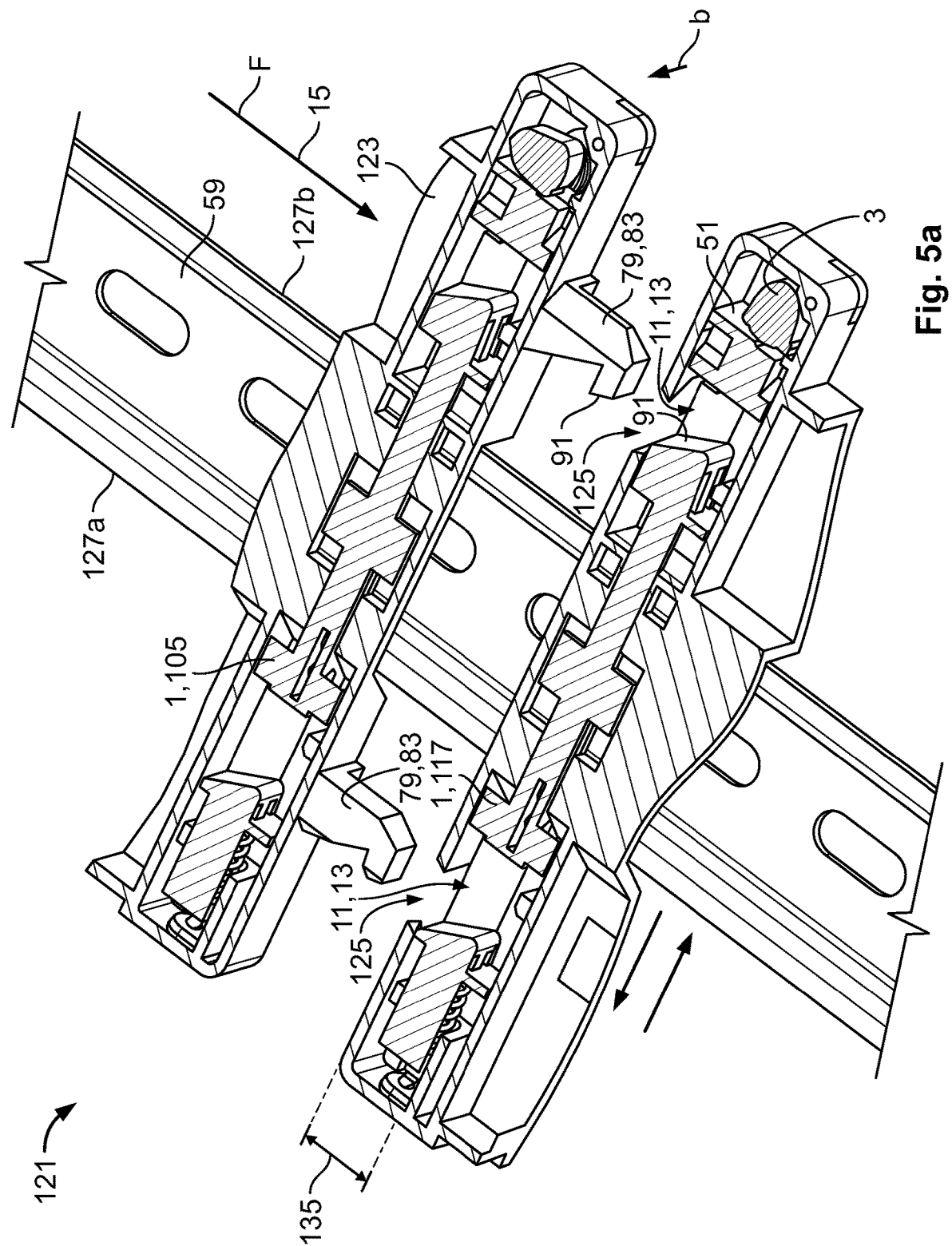
FIG. 5A is a sectional perspective view of a set of rail fixing systems before coupling.

As shown in FIG. 5A, the actuation device 1 of the first rail fixing system 57a is in the closed position 117 whereas the actuation device 1 of the second rail fixing system 57b is in the displacement position 105. Consequently, the first rail fixing system 57a is securely connected to the profile rail 59, whereas the second rail fixing system 57b is movable along or counter to the transverse direction 15 on the profile rail 59.

The first rail fixing system 57a, as shown in FIG. 5A, has housing openings 125 which are directed counter to the transverse direction 15. The counter-elements 79 of the second rail fixing system 57b in the form of catch hooks 83 are directed in the transverse direction 15. In the transverse direction 15, the housing openings 125 each afford access to the second positive-locking connection element 11 which is in the form of a catch opening 13. As a result of the size and/or form and/or extent direction and/or number of the catch openings 13 and catch hooks 83, it is possible to encode a desired variant of the rail fixing system 57.

As shown in FIG. 5A, both the housing openings 125 and the catch hooks 83 are arranged at both sides of the profile rail 59, wherein the housing opening 125 which is arranged at one side of the profile rail 59 is located with the same spacing from the profile rail 59 as the catch hook 83 which is arranged at the same side. In order to engage both rail fixing systems 57a, 57b, the second rail fixing system 57b is moved in a transverse direction 15 towards the first rail fixing system 57a.

As shown in FIG. 5B, both rail fixing systems 57a, 57b are moved towards each other until they are so close that the catch hook 83 of the second rail fixing system 57b projects through the housing openings 125 of the first rail fixing system 57a into the interior of the housing 63 and into the catch openings 13. The first mechanical contact between the catch hook 83 of the second rail fixing system 57b and the actuation device 1 of the first rail fixing system is brought about between the inclined introduction member 93 of the actuation device 1 and the inclined introduction member 91 of the catch hook 83.

As shown by the auxiliary line 115 and the additional auxiliary line 115a in FIG. 4C, the inclined introduction member 91 of the catch wall 29 and the inclined introduction member 91 of the catch hook 83 touch each other. This assessment can be carried out only when structurally identical rail fixing systems 57 are connected to each other. As a result of both inclined introduction members 91 striking each other, that is to say, the member of the catch hook 83 of the second rail fixing system 57b and the member of the actuation device 1 of the first rail fixing system 57a, the actuation device 1 of the first rail fixing system 57a is redirected in the actuation direction 6 because the inclined introduction members 91 redirect in the actuation direction 6 the force F which is applied during the movement of the second rail fixing system 57b in the transverse direction 15. The force F' shown in FIG. 5B is redirected by the inclined introduction members 91 and acts in an actuation direction 6 counter to the resilient element 47 so that it is compressed.

In FIG. 5A, the covered first positive-locking connection element 7 abuts against the rear edge 127a of the profile rails 59 while the non-movable clamping jaw 9c abuts against the front edge 127b of the profile rail 59. In the closed position 117 of the actuation device 1 of the first rail fixing system 57a, consequently, the resilient force FF which is transmitted by the resilient element 47 counter to the actuation direction 6 to the actuation device 1 which is located in the closed position 117 acts on the covered first positive-locking connection element 7 but not on the cam 3. For this reason, a play 109 exists between the cam 3 and the abutment face 51 of the actuation device 1 of the first rail fixing system 57a.

In FIG. 5B, the actuation device 1 of the first rail fixing system 57a has been redirected in the actuation direction 6 so that a spacing 129 is formed between the cam 3 and the actuation face 51. The actuation device 1 of the first rail fixing system 47a is located in an intermediate position 131 which is dependent on an insertion depth 133 of the catch hook 83 and which cannot be engaged.

Figure 5C:
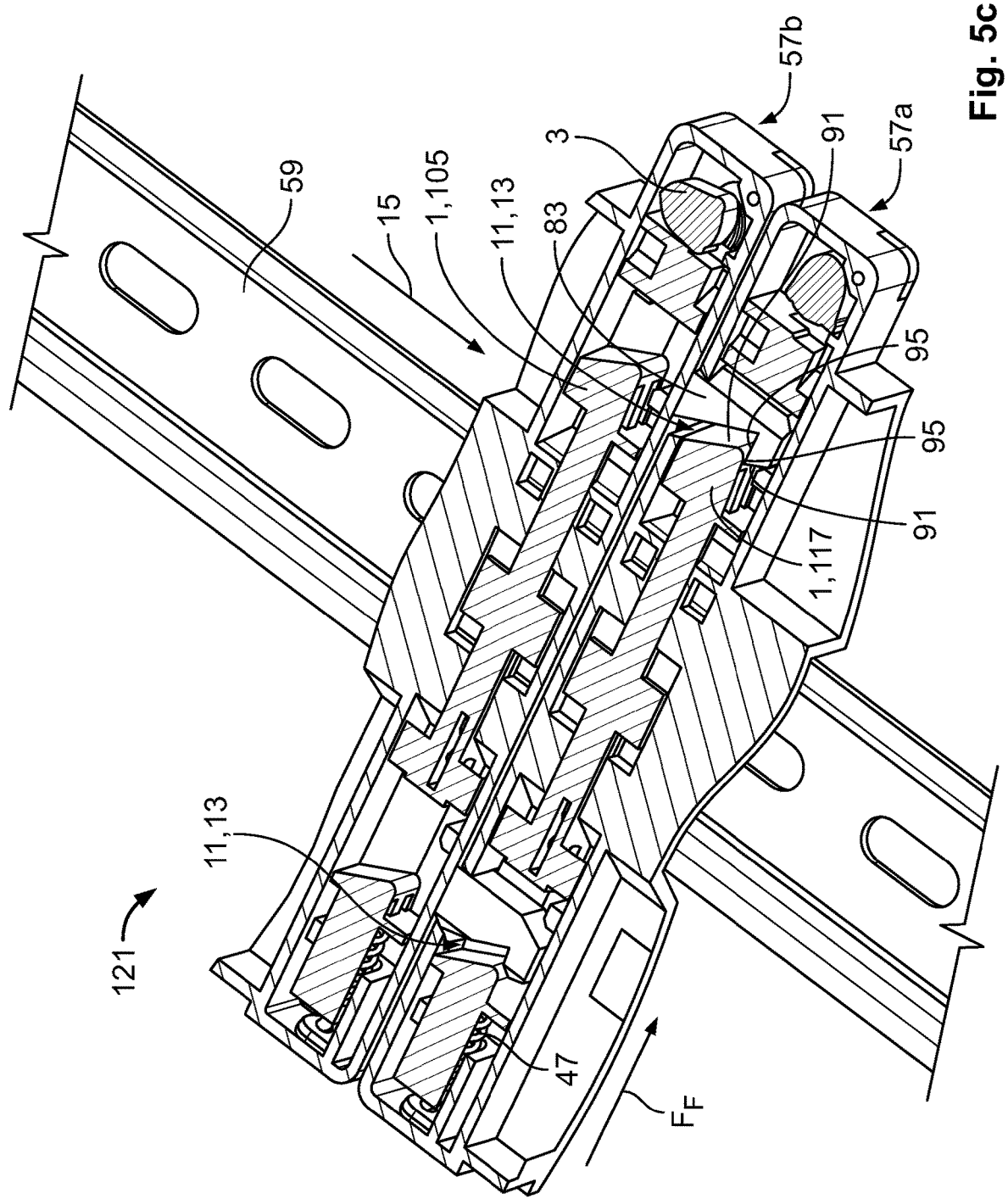
FIG. 5C is a sectional perspective view of the set of rail fixing systems after coupling.

A completed coupling of the set of rail fixing systems 121 is shown in FIG. 5C. The catch hooks 83 of the second rail fixing system 57*b* are brought into positive-locking engagement with the respective catch openings 13 of the actuation device 1 of the first rail fixing system 57*a*. The arrangement of both rail fixing systems 57*a*, 57*b* as shown in FIG. 5C is achieved as soon as the insertion depth 133 reaches or exceeds the actuation spacing 135 shown in FIG. 5A as a result of the displacement of the second rail fixing system 57*b* on the profile rail 59 in the transverse direction 15.

In the state shown in FIG. 5C, the two inclined insertion members 91 of the catch hook 83 and the actuation device 1 of the first rail fixing system 57*a* are no longer in mechanical contact with each other and the resilient force FF of the resilient element 47 moves the actuation device 1 of the first rail fixing system 57*a* back into the closed position 117. The catch hooks 83 are completely received in the catch openings 13. With the active housing coupling shown in FIG. 5C between the two rail fixing systems 57*a*, 57*b*, it is no longer possible to separate the two rail fixing systems 57*a*, 57*b* from each other without actuating the actuation device 1 of the first rail fixing system 57*a*. The catch face 95 of the catch wall 29 abuts against the catch face 95 of the catch hook 83 and consequently prevents a movement of the two rail fixing systems 57*a*, 57*b* apart from each other. The actuation device of the second rail fixing system 57*b* is further located in FIG. 5C in the displacement position 105 and, in another step which is not shown, can also be moved into the closed position 117 by the cam 3.

Figure 6:
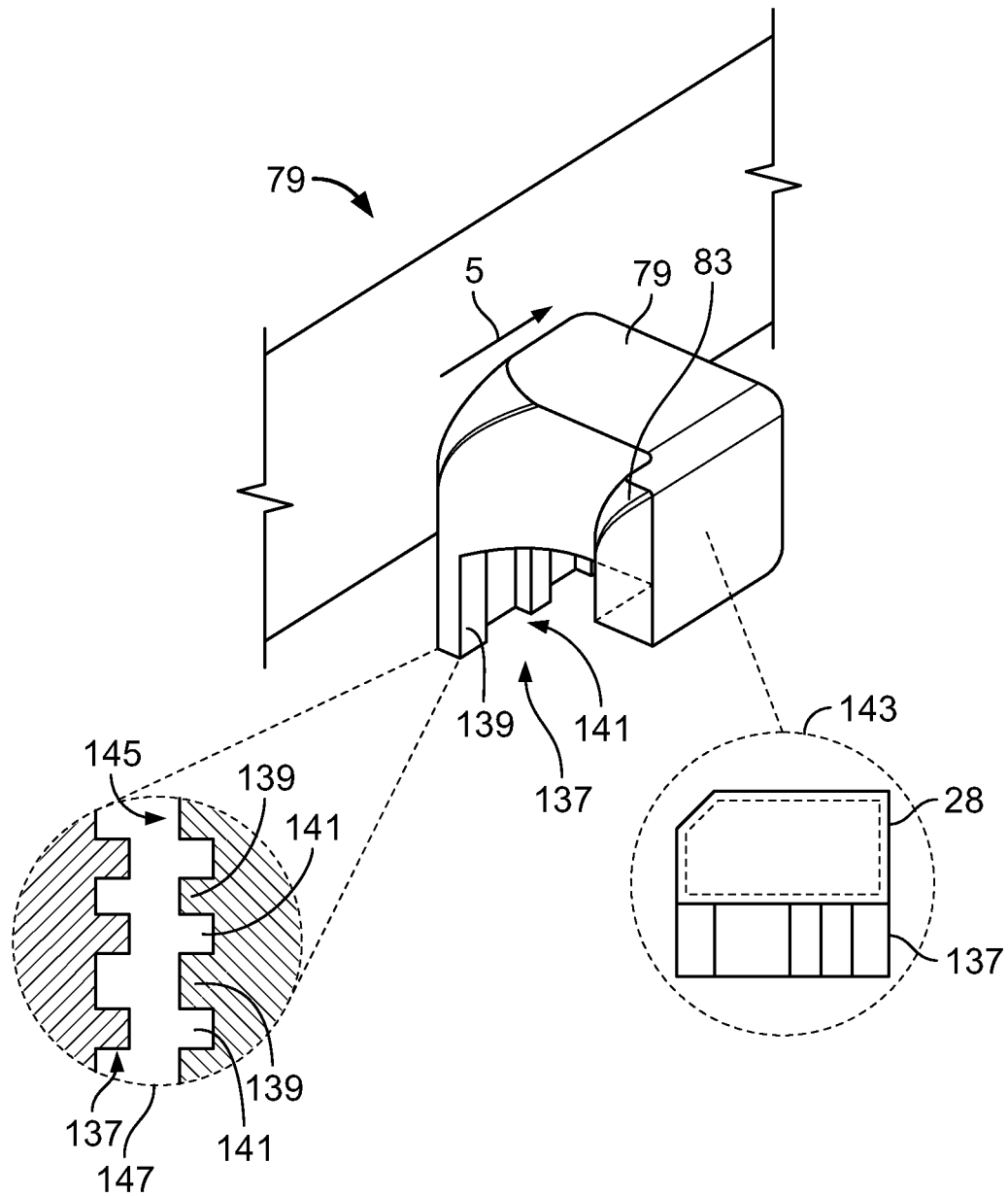
FIG. 6 is a perspective view of a counter-element of the rail fixing system.

The counter-element 79 is shown in greater detail in FIG. 6. The counter-element 79 has the catch hook 83 and further has a coupling control counter-contour 137. The coupling control counter-contour 137 includes projections 139 and recesses 141. The projections 139 and recesses 141 are arranged with different spacings from each other in the longitudinal direction 5. A first cutout 143 shows the side view of the counter-element 79 and in particular the contour 28 and coupling control counter-contour 137 thereof. The contour 28, in the shown embodiment, is in the form of a parallelogram. The coupling control counter-contour 137 is constructed so as to be brought into engagement with a complementary coupling control contour 145; the coupling control contour 145 is schematically illustrated as a cross-section in the second cutout 147. In various embodiments, the coupling control contour 145 has projections 139 and recesses 141 in different forms and/or numbers.

Subsequently, additional rail fixing systems 57 can be positioned on the profile rail 59 on the right beside the second rail fixing system 57*b*, can be pushed from the right towards the second rail fixing system 57*b* and can be engaged therewith by means of actuation of the actuation device 1 of the rail fixing system 57 which is intended to be connected. An engagement of the last-connected rail fixing system 57 with the profile rail 59 is also associated with the engagement with the first rail fixing system 57*a*.

The mechanical connection of adjacent rail fixing systems 57*a*, 57*b* increases the resistance of the individual rail fixing systems to slippage on the profile rail 59 because a single rail fixing system does not have to apply this resistance alone; instead an assembly of rail fixing systems acts counter to a possible displacement. The system coupling can also act as a fail-safe system for fixing the rail fixing system 57 to the profile rail 59. If the fixing of the rail fixing system 57 is defective or does not ensure an adequate clamping of the rail fixing system 57 to the profile rail 59, this can lead to the affected rail fixing system 57 falling off the profile rail 59 in an uncontrolled manner or to an uncontrolled displacement of the affected rail fixing system 57 along the profile rail 59. In the case of coupled rail fixing systems 57*a*, 57*b*, the assembly may prevent a single defective rail fixing system from falling off and/or being displaced in an uncontrolled manner.

Because the actuation device 1 is supported on at least one resilient element 47, and the first positive-locking connection element 7, the second positive-locking connection element 11, and the resilient element 47 are arranged along a straight line which extends in the effective direction of the resilient element 47, the rail fixing system 57 and the system coupling are placed in a mutually effective connection not only functionally but also are combined in a compact form in spatial terms by the rail fixing system 57 and the system coupling being arranged along the force path FF of the resilient element 47. A stable positive-locking connection of the positive-locking connection elements 7, 11 is as a result of the central arrangement of the positive-locking connection elements 7, 11 in the force path FF, leading to higher retention forces. The retention forces of the prior art are generally limited not by the resilient force of the resilient element as a result of positive-locking connection elements which are arranged outside the force path, but instead by the actuation device tilting as a result of the decentralised arrangement.

In an embodiment, the actuation device 1 can have a plurality of cams 3, wherein the cams 3 when viewed in the actuation direction 6 can each be arranged at one side of the rail receiving member 77 or at opposite sides of the rail receiving member 77. If the at least two cams 3 are arranged opposite each other, one cam 3 can be responsible for the movement of the actuation device in the actuation direction 6 and the opposite cam 3 for the opposing movement.

What is claimed is:
1. A rail fixing system, comprising:
a rail fixing arrangement adapted to fix the rail fixing system to a profile rail, the rail fixing arrangement having a first positive-locking connection element;
a system coupling arrangement adapted to fix the rail fixing system to another rail fixing system disposed adjacent to the rail fixing system on the profile rail, the system coupling arrangement having a second positive-locking connection element; and
an actuation device common to the rail fixing arrangement and the system coupling arrangement and connected to the first positive-locking connection element and the second positive-locking connection element, the actuation device is supported on a resilient element, the first positive-locking connection element, the second positive-locking connection element, and the resilient element are arranged along a straight line that extends in an effective direction of the resilient element, the actuation device has a cam that is rotatable, a position of the first positive-locking connection element and a position of the second positive-locking connection element depend on a rotational position of the cam.

2. The rail fixing system of claim 1, wherein the profile rail is a top hat rail.

3. The rail fixing system of claim 1, further comprising a rail receiving member that is continuous in a passage direction of the profile rail.

4. The rail fixing system of claim 3, wherein the actuation device can be displaced transversely relative to the passage direction.

5. The rail fixing system of claim 3, wherein the straight line extends through the rail receiving member.

6. The rail fixing system of claim 1, wherein the actuation device has a displacement position between an open position and a closed position, the actuation device engages the profile rail in the displacement position but is movable along the profile rail.

7. The rail fixing system of claim 6, wherein the first positive-locking connection element projects in or counter to the effective direction of the resilient element and into the rail receiving member to a lesser extent in the displacement position than in the closed position.

8. The rail fixing system of claim 1, wherein the actuation device is substantially completely received inside a housing of the rail fixing system.

9. The rail fixing system of claim 1, wherein the second positive-locking connection element is a positive-locking connection opening which opens substantially perpendicularly to the straight line and is completely surrounded by a closed peripheral wall.

10. The rail fixing system of claim 9, wherein the positive-locking connection opening is formed by a contour of the closed peripheral wall.

11. The rail fixing system of claim 10, further comprising a counter-element disposed at one of a pair of lateral faces of a housing of the rail fixing system that are disposed opposite each other in a passage direction, the counter-element is formed to complement the second positive-locking connection element.

12. The rail fixing system of claim 11, wherein the counter-element has a coupling control contour which includes a protrusion or recess extending in the passage direction.

13. The rail fixing system of claim 1, wherein the actuation device is supported at a center of the rail fixing system in a direction perpendicular to a passage direction.

14. The rail fixing system of claim 1, further comprising a display element connected to the actuation device and movable with the actuation device for displaying a position of the actuation device in a manner visible from outside the rail fixing system.

15. The rail fixing system of claim 14, wherein the display element is monolithically formed in a single piece with the actuation device.

16. The rail fixing system of claim 1, wherein the first positive-locking connection element is disposed at a side of a rail receiving member opposite the cam.

17. A set of a plurality of rail fixing systems each fixed to a profile rail, each of the rail fixing systems comprises:
   a rail fixing arrangement adapted to fix the rail fixing system to the profile rail, the rail fixing arrangement having a first positive-locking connection element;
   a system coupling arrangement adapted to fix the rail fixing system to another rail fixing system disposed adjacent to the rail fixing system on the profile rail, the system coupling arrangement having a second positive-locking connection element; and
   an actuation device common to the rail fixing arrangement and the system coupling arrangement and connected to the first positive-locking connection element and the second positive-locking connection element, the actuation device is supported on a resilient element, the first positive-locking connection element, the second positive-locking connection element, and the resilient element are arranged along a straight line that extends in an effective direction of the resilient element, the actuation device has a cam that is rotatable, a position of the first positive-locking connection element and a position of the second positive-locking connection element depend on a rotational position of the cam.

* * * * *